United States Patent [19]

Igarashi et al.

[11] Patent Number: 5,294,835
[45] Date of Patent: Mar. 15, 1994

[54] EPOXY RESIN COMPOSITION FOR SEMICONDUCTOR ENCAPSULATION AND SEMICONDUCTOR DEVICE USING THE SAME

[75] Inventors: Kazumasa Igarashi; Hideto Kimura; Megumu Nagasawa; Tsutomu Nishioka; Kazuhiro Ikemura; Hideyuki Usui; Michio Komoto; Haruo Tabata; Satoshi Ito, all of Osaka, Japan

[73] Assignee: Nitto Denko Corporation, Osaka, Japan

[21] Appl. No.: 920,657

[22] Filed: Jul. 28, 1992

[51] Int. Cl.$^5$ .................................. H01L 23/28
[52] U.S. Cl. .................................. 257/793; 257/788; 528/406
[58] Field of Search ............... 257/793, 788, 791; 528/403, 405, 406, 407, 421, 10, 30, 38, 86

[56] References Cited

U.S. PATENT DOCUMENTS

| 4,072,656 | 2/1978 | Hartmann | 528/124 |
| 4,153,621 | 5/1979 | Hartmann | 549/560 |

FOREIGN PATENT DOCUMENTS 0384707  2/1990  European Pat. Off.

*Primary Examiner*—Sara W. Crane
*Attorney, Agent, or Firm*—Sughrue, Mion, Zinn, Macpeak & Seas

[57] ABSTRACT

A semiconductor device in which a semiconductor chip is encapsulated in an epoxy resin composition comprising (A) an epoxy resin represented by formula (I):

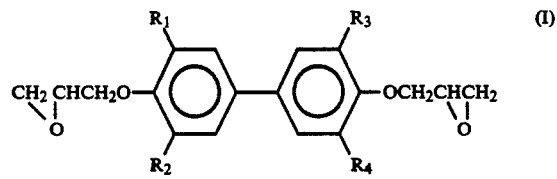

wherein $R_1$, $R_2$, $R_3$, and $R_4$ each represents an alkyl group having from 1 to 4 carbon atoms, and (B) a reaction product obtained by preliminarily reacting a silane compound represented by formula (II):

$$(X)_{n+1}Si(Y)_{3-n} \quad (II)$$

wherein X represents a monovalent organic group having at least one functional group selected from the group consisting of a glycidyl group, an amino group, and a mercapto group; Y represents an alkoxy group having from 1 to 4 carbon atoms; and n represents 0, 1 or 2, with a phenol aralkyl resin represented by formula (III)

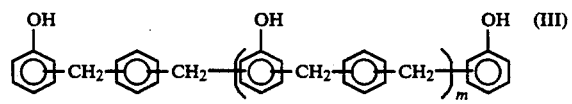

wherein m represents 0 or a positive integer. The epoxy resin composition has low moisture absorption and low stress to provide a semiconductor device excellent in thermal crack resistance and moisture resistance.

8 Claims, 1 Drawing Sheet

EPOXY RESIN COMPOSITION FOR SEMICONDUCTOR ENCAPSULATION AND SEMICONDUCTOR DEVICE USING THE SAME

FIELD OF THE INVENTION

This invention relates to an epoxy resin composition for encapsulation of a semiconductor chip and to a semiconductor device excellent in reliability against both thermal impact and moisture.

BACKGROUND OF THE INVENTION

A semiconductor device, such as a transistor, an IC, and an LSI, is encapsulated (sealed) in a package, such as a plastic seal package, for protection from the outer environment and easy handling. Such a package typically includes a dual inline package (DIP). DIP is a pin insertion type package, which is mounted on a substrate by inserting pins into through-holes of the substrate.

In recent years, the integration density and speed of semiconductor devices such as LSI chips have been increasing. Not only with the technological advancements but with an increasing demand for small-sized electronic parts to have high performance, the pin insertion type packages such as DIP have been displaced with flat packages for surface mounting. In the packages for surface mounting, pins are led out flatly and directly bonded to the surface of a substrate by soldering. Such semiconductor devices for surface mounting enjoy thinness, lightness, and smallness and are therefore advantageous in that the area ratio on the substrate is so reduced and that they may be mounted on both sides of a substrate.

On the other hand, the integration density of semiconductor devices, which is increasing year by year as is typically seen in memory devices and micro processors, has been achieved through advanced techniques of fine patterning and increase of the chip scale. This leads to confrontation between size reduction of a seal package and size increase of a chip. As a result, the plastic seal part has been necessarily made thinner.

Where the package for surface mounting contains moisture before surface mounting, there is a problem that the moisture is vaporized on soldering to cause package cracking. As shown in FIG. 1, the moisture passes through sealing resin 1 and enters into the inside of package 3 as indicated by arrow A and remains mostly on the surface of silicon chip 7 or on the back side of die bonding pad 4. When the package is mounted on a substrate by soldering, for example, vapor phase soldering, the remaining moisture is vaporized by the heat of soldering. As a result, the vapor pressure pushes down the resin part on the back side of die bonding pad 4 to make gap 5 and, at the same time, to cause crack 6 in package 3 as shown in FIG. 2. In FIGS. 1 and 2, numeral 8 indicates a bonding wire.

In order to overcome this problem, it has been proposed to put the whole device, i.e., the package, under moistureproof seal until it is surface mounted. It has also been proposed that the package is dried at 100° C. for 24 hours for moisture exclusion immediately before surface mounting by soldering. While these proposals have already been put to practice, such prehandling requires time and labor.

On the other hand, to make a semiconductor device larger is accompanied by problems attributed to thermal stresses, such as passivation layer crack and deformation of an aluminum pattern. These problems have been overcome usually by using a resin composition having dispersed therein a soft substance, e.g., rubber or silicone, as a sealing resin thereby to reduce the stress. Such a means being taken, however, the moisture diffusion coefficient of the sealing resin increases, which is disadvantageous from the standpoint of prevention of package cracking on soldering.

SUMMARY OF THE INVENTION

An object of the present invention is to provide a semiconductor device which needs no prehandling prior to mounting on a substrate and which has resistance to thermal stress-cracking sufficient for withstanding heat of soldering.

The above object of the present invention is accomplished by using, as a sealing resin, an epoxy resin composition comprising (A) an epoxy resin represented by formula (I):

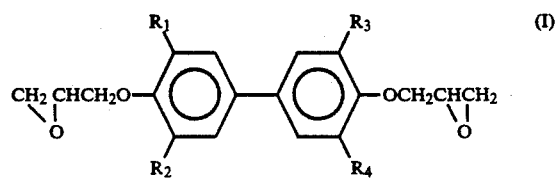

wherein $R_1$, $R_2$, $R_3$, and $R_4$ each represents an alkyl group having from 1 to 4 carbon atoms, and (B) a reaction product obtained by preliminarily reacting a silane compound represented by formula (II):

wherein X represents a monovalent organic group having, at the terminal thereof, at least one functional group selected from the group consisting of a glycidyl group, an amino group, and a mercapto group; Y represents an alkoxy group having from 1 to 4 carbon atoms; and n represents 0, 1 or 2, with a phenol aralkyl resin represented by formula (III):

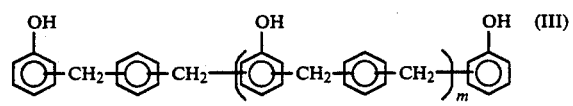

wherein m represents 0 or a positive integer.

BRIEF DESCRIPTION OF THE DRAWINGS

FIG. 3-(B) is a front view of the specimen of FIG. 3-(A).

DETAILED DESCRIPTION OF THE INVENTION

Figure 1:
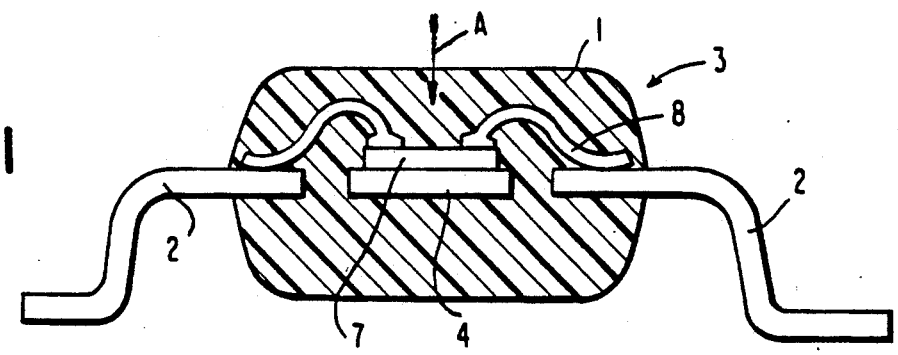
FIGS. 1 and 2 each is a cross section of a conventional semiconductor device, showing the mechanism of package cracking.
Figure 2:
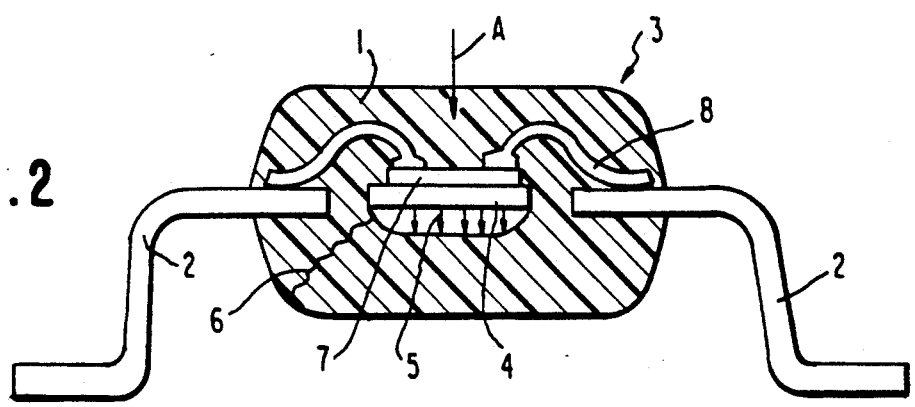

There are three approaches one may take for preventing package cracking:—(1) to control moisture absorption of a sealing resin, (2) to increase adhesion of a sealing resin to the back side of a die bonding pad and to the surface of a semiconductor chip, and (3) to increase strength of a sealing resin per se. Based on the first and second approaches, the concept of the present invention consists in great reduction of moisture absorption of a sealing resin and enhancement of adhesion of a sealing resin. To these effects, use of the above-described specific components (A) and (B) has made it possible to maintain considerably improved resistance to package cracking and moisture-resistant reliability on exposure to high soldering temperatures (e.g., 215° to 260° C.).

It has also been found that modification of the component (A) and/or the component (B) with a silicone compound brings about stress reduction as well as further improvements in resistance to package cracking and moisture-resistant reliability.

The epoxy resin composition according to the present invention comprises (A) a biphenyl type epoxy resin of formula (I) and (B) a preliminary reaction product between a silane compound of formula (II) and a phenol aralkyl resin of formula (III). The composition is usually supplied as a powder or a tablet.

As shown in formula (I), the epoxy resin which can be used in the present invention possesses water repellency owing to the lower alkyl groups added to each of the glycidyl-containing phenyl rings. Component (A) may be comprised solely of the epoxy resin of formula (I) or may be partially replaced with commonly employed other epoxy resins. In the latter case, the epoxy resin of formula (I) is preferably used in an amount of at least 20% by weight, and particularly at least 50% by weight, based on the weight of the total epoxy resin components. Examples of usable other epoxy resins include cresol novolak type epoxy resins, phenol novolak type epoxy resins, bisphenol A novolak type epoxy resins, and bisphenol A type epoxy resins. The novolak type epoxy resins to be used usually have an epoxy equivalent of from 150 to 250 and a softening point of from 50° to 130° C. The cresol novolak type epoxy resins to be used usually have an epoxy equivalent of from 180 to 210 and a softening point of from 60° to 110° C.

Component (B) which can be used in the present invention is a compound obtained by the reaction between the organic group X and alkoxy group Y of a silane compound of formula (II) and the hydroxyl group of a phenol aralkyl resin of formula (III), followed by removal of an alcohol by-produced.

The silane compound of formula (II) includes silane coupling agents. Specific examples of suitable silane coupling agents are N-(2-aminoethyl)-3-aminopropylmethyldimethoxysilane, N-(2-aminoethyl)-3-aminopropyltrimethoxysilane, 3-aminopropyltrimethoxysilane, 3-aminopropyltriethoxysilane, N,N-bis[(methyldimethoxysilyl)propyl]amine, N,N-bis[3-(methyldimethoxysilyl)propyl)ethylenediamine, N,N-bis[3-(trimethoxysilyl)propyl]amine, N,N-bis[3-(trimethoxysilyl)propyl]ethylenediamine, 3-(N,N-diglycidyl)aminopropyltrimethoxysilane, N-glycidyl-N,N-bis[3-(methyldimethoxysilyl)propyl]amine, N-glycidyl-N,N-bis[3-(trimethoxysilyl)propyl]amine, 3-glycidoxypropylmethyldimethoxysilane, 3-glycidoxypropyltrimethoxysilane, 3-mercaptopropyltrimethoxysilane, N-[(3-trimethoxysilyl)propyl]diethylenetriamine, N-[(3-trimethoxysilyl)propyl]triethylenetetramine, and N-3-trimethoxysilylpropyl-m-phenylenediamine.

The phenol aralkyl resin of formula (III) acts as a curing agent for the above-described epoxy resin of formula (I). It can be obtained by reacting an aralkyl ether and a phenol in the presence of a Friedel-Crafts catalyst. A generally known compound included in the phenol aralkyl resin (III) is a polycondensation product obtained from α,α'-dimethoxy-p-xylene and a phenol monomer. The phenol aralkyl resin (III) preferably has a softening point of from 70° to 110° C. and a hydroxyl equivalent of from 150 to 220. The phenol aralkyl resin (III) may used in combination with other phenol resins commonly employed as a curing agent for epoxy resins. In this case, the phenol aralkyl resin (III) is preferably used in an amount of at least 50% by weight, and more preferably at least 70% by weight, based on the weight of the total curing agent. The other phenol resins which may be used in combination include phenol novolak resins and cresol novolak resins and preferably have a softening point of from 50° to 110° C. and a hydroxyl equivalent of from 70 to 150. The curing agent, inclusive of the phenol resins other than the phenol aralkyl resin (III), is usually used in such an amount as to have a hydroxyl group of from 0.7 to 1.3 equivalents per epoxy equivalent of the specific epoxy resin (I) of component (A).

Component (B) can be prepared by, for example, reacting the silane compound (II) and the phenol aralkyl resin (III) at a temperature of from 120° to 180° C., and preferably from 130 to 150° C., in a reactor equipped with a stirrer and then driving a by-produced alcohol out of the reaction system by, for example, degassing at 130° to 180° C.

It is preferable that the epoxy resin (I) (component A) and/or reaction product (component (B)) is/are previously modified with an organopolysiloxane represented by formula (IV):

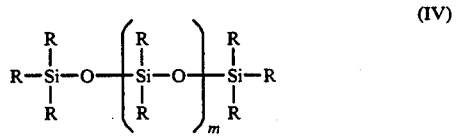

wherein R's, which may be the same or different, each represent a monovalent organic group, provided that at least two of them are selected from the group consisting of an amino-substituted organic group, an epoxy-substituted organic group, a hydroxyl-substituted organic group, a vinyl-substituted organic group, a mercapto-substituted organic group, and a carboxyl-substituted organic group; and m represents an integer of from 0 to 500.

The organopolysiloxane-modified component (A) and/or (B) have/has improved stress reducing properties. The organopolysiloxane of formula (IV) is suitably used in an amount of from 1 to 7% by weight based on the weight of the total epoxy resin composition.

If desired and necessary, the epoxy resin composition of the present invention may further contain additives, such as inorganic fillers, curing accelerators, flame retardants, coupling agents, and waxes.

Suitable inorganic fillers include crystalline or fusing fillers and, in addition, aluminum oxide, beryllium oxide, silicon carbide, and silicon nitride. Suitable curing accelerators include amine type compounds, phosphorous type compounds, boron type compounds, and phosphorous-boron type compounds, used either alone or in combinations thereof.

Suitable flame retardants include novolak type brominated epoxy resins, bisphenol A type brominated epoxy resins, antimony trioxide, and antimony pentoxide, used either singly or in combinations thereof.

Suitable coupling agents include methoxy or ethoxysilane compounds of glycidyl ether type, amine type, thiocyan type, urea type, etc., used either alone or in combinations thereof.

While not limiting, the coupling agent may be incorporated by dry blending with an inorganic filler, preliminarily reacting with an inorganic filler by heating, or premixing with an organic component raw material.

Suitable waxes include higher fatty acids, higher fatty acid esters, and higher fatty acid calcium salts, used either alone or in combinations thereof.

If desired and necessary, the epoxy resin composition of the invention may furthermore contain a silicone oil or a rubber component, such as a silicone rubber or a synthetic rubber for the purpose of stress reduction and may additionally contain an ion trapping agent, such as hydrotalcite, for the purpose of improving reliability in moisture resistant reliability testing.

The epoxy resin composition of the present invention can be prepared, for example, by premixing component (B) prepared by preliminarily reacting the silane compound (II) and the phenol aralkyl resin (III) and component (A) at an appropriate mixing ratio, melt-kneading the blend in a kneader, e.g., a mixing roll, under heating, followed by cooling to room temperature, grinding in a known manner, and, if desired, tableting. In using an organopolysiloxane-modified component, either one or both of components (A) and (B) are previously reacted with the organopolysiloxane (IV) and then mixed with other components in the same manner as described above.

Encapsulation (or sealing) of a semiconductor chip with the epoxy resin composition according to the present invention is not particularly limited and is usually carried out by known resin molding techniques, such as transfer molding.

Since the plastic seal has reduced moisture absorption and enhanced adhesion to a chip because of the actions of components (A) and (B), the resulting semiconductor device is excellent in both thermal impact resistance and moisture resistant reliability and undergoes no package cracking on soldering.

As described above, the semiconductor device according to the present invention in which a semiconductor chip is encapsulated in the epoxy resin composition comprising components (A) and (B) exhibits high adhesive strength between the chip and the plastic seal and suffers from no package cracking under severe conditions as in soldering, showing excellent moisture resistant reliability. Further, where component (A) and/or component (B) is/are modified with a silicone compound, the resin composition has further reduced stress, and the semiconductor device has so much improved thermal impact resistance.

The present invention is now described in greater detail by reference to Examples, but it should be understood that the present invention is not deemed to be limited thereto. All the parts are given by weight unless otherwise indicated.

In carrying out the Examples and the Comparative Examples, the following compounds were prepared beforehand.

Epoxy Resin A 4,4'-Bis(2,3-epoxypropoxy)-3,3',5,5'-tetramethylbiphenyl (epoxy equivalent: 195)

Epoxy Resin B o-Cresol novolak type epoxy resin (epoxy equivalent: 195)

Phenol Resin C

Phenol aralkyl resin of formula (III) (softening point: 76° C.; hydroxyl equivalent: 175)

Phenol Resin D

Phenol novolak resin (softening point: 83° C.; hydroxyl equivalent: 106)

Silane Compound E

3-Glycidoxypropyltrimethoxysilane

Silane Compound F

3-Aminopropyltrimethoxysilane

Silane Compound G

3-Mercaptopropyltrimethoxysilane

Organopolysiloxane H:

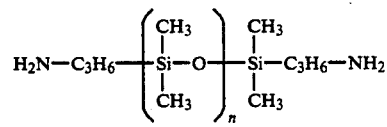

Organopolysiloxane I:

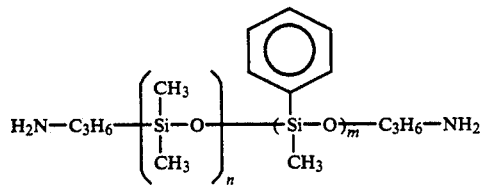

Organopolysiloxane R:

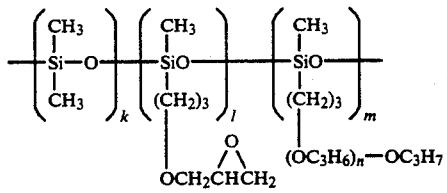

Inorganic Filler

Fused silica powder (average particle size: 15 μm; maximum particle size: 150 μm; shape: crushed)

Flame Retardant J

Antimony trioxide

Flame Retardant K

Novolak type brominated epoxy resin (softening point: 80° C.; epoxy equivalent: 275)

Curing Accelerator 1,8-Diazabicyclo[5.4.0]undecene-7

Release Agent

Polyethylene wax

Phenol resin C and/or D and silane compound E, F, or G were charged in a reactor equipped with a stirrer at a ratio shown in Table 1 below and reacted under conditions shown in the Table. The reaction mixture was degassed at 170° C. to obtain reaction products L to Q.

TABLE 1

| | Reaction Product | | | | | |
|---|---|---|---|---|---|---|
| | L | M | N | O | P | Q |
| Reactants (parts): | | | | | | |
| Phenol Resin C | 175 | 175 | 175 | 87.5 | — | 175 |
| Phenol Resin D | — | — | — | 53 | 106 | — |
| Silane Compound E | 3.5 | — | — | 3.3 | 3.5 | 2.0 |
| Silane Compound F | — | 3.5 | — | — | — | — |
| Silane Compound G | — | — | 3.5 | — | — | 1.5 |
| Reaction Conditions: | | | | | | |
| Temp. (°C.) | 140 | 140 | 140 | 140 | 140 | 140 |
| Time (min) | 60 | 10 | 10 | 60 | 60 | 60 |

Epoxy resin A and/or B and organopolysiloxane H or I were mixed at a ratio shown in Table 2 below, and the mixture was allowed to react with stirring at 170° C. for 5 hours to prepare modified epoxy resins (a) to (f).

TABLE 2

| | Modified Epoxy Resin | | | | | |
|---|---|---|---|---|---|---|
| | (a) | (b) | (c) | (d) | (e) | (f) |
| Reactants (parts): | | | | | | |
| Epoxy Resin A | 100 | — | 50 | 100 | — | 50 |
| Epoxy Resin B | — | 100 | 50 | — | 100 | 50 |
| Organopolysiloxane H | 25 | 25 | 25 | — | — | — |
| Organopolysiloxane I | — | — | — | 25 | 25 | 25 |

Similarly, reaction products L, M, or O and organopolysiloxane R were reacted at a ratio shown in Table 3 below at 170° C. for 5 hours to obtain modified reaction products (g), (h), or (i), respectively.

TABLE 3

| | (q) | (h) | (i) |
|---|---|---|---|
| Reactants (parts): | | | |
| Reaction Product L | 178.5 | — | — |
| Reaction Product M | — | 178.5 | — |
| Reaction Product O | — | — | 143.8 |
| Organopolysiloxane R | 44.6 | 44.6 | 36.0 |

EXAMPLES 1 to 14 AND COMPARATIVE EXAMPLES 1 to 8

Reaction products L to Q, epoxy resins A and B, modified epoxy resins (a) to (f), modified reaction products (g) to (i), and other additives were mixed at a ratio shown in Table 4-1 and 4-2 below. The mixture was kneaded in a mixing roll at 100° C. for 10 minutes to prepare a sheet. The sheet was ground to obtain a powdered epoxy resin composition.

TABLE 4

| | Example No. | | | | | | | Comparative Example No. | | | |
|---|---|---|---|---|---|---|---|---|---|---|---|
| | 1 | 2 | 3 | 4 | 5 | 6 | 7 | 1 | 2 | 3 | 4 |
| Components (parts): | | | | | | | | | | | |
| Epoxy Resin A | 190 | 190 | 190 | 95 | 190 | 133 | 190 | — | 190 | 190 | — |
| Epoxy Resin B | — | — | — | 95 | — | 57 | — | 190 | — | — | 190 |
| Reaction Product | L | M | N | L | O | L | Q | L | P | P | P |
| | 178.5 | 178.5 | 178.5 | 178.5 | 143.8 | 178.5 | 178.5 | 178.5 | 109.5 | 178.5 | 109.5 |
| Inorganic Filler | 900 | 900 | 900 | 900 | 810 | 900 | 900 | 900 | 715 | 900 | 715 |
| Flame Retardant J | 22 | 22 | 22 | 22 | 20 | 22 | 22 | 22 | 18.2 | 22 | 18.2 |
| Flame Retardant K | 22 | 22 | 22 | 22 | 20 | 22 | 22 | 22 | 18.2 | 22 | 18.2 |
| Curing Accelerator | 3 | 3 | 3 | 3 | 2.5 | 3 | 3 | 3 | 2.2 | 3 | 2.2 |
| Release Agent | 4 | 4 | 4 | 4 | 3.9 | 4 | 4 | 4 | 3.5 | 4 | 3.5 |

| | Example No. | | | | | | | Comparative Example No. | | | |
|---|---|---|---|---|---|---|---|---|---|---|---|
| | 8 | 9 | 10 | 11 | 12 | 13 | 14 | 5 | 6 | 7 | 8 |
| Components (parts): | | | | | | | | | | | |
| Epoxy Resin | (a) | (c) | (d) | (f) | A | A | A | B | (b) | (b) | (e) |
| | 237.5 | 237.5 | 237.5 | 237.5 | 190 | 190 | 190 | 190 | 237.5 | 237.5 | 237.5 |
| Reaction Product | L | M | L | L | (g) | (h) | (i) | C | D | M | L |
| | 178.5 | 178.5 | 178.5 | 178.5 | 223.1 | 223.1 | 179.8 | 223.1 | 106 | 178.5 | 178.5 |
| Inorganic Filler | 1000 | 1000 | 1000 | 1000 | 1000 | 1000 | 1000 | 1000 | 1000 | 1000 | 1000 |
| Flame Retardant J | 22 | 22 | 22 | 22 | 22 | 22 | 22 | 22 | 22 | 22 | 22 |
| Flame Retardant K | 22 | 22 | 22 | 22 | 22 | 22 | 22 | 22 | 22 | 22 | 22 |
| Curing Accelerator | 3 | 3 | 3 | 3 | 3 | 3 | 3 | 3 | 3 | 3 | 3 |
| Release Agent | 4 | 4 | 4 | 4 | 4 | 4 | 4 | 4 | 4 | 4 | 4 |

Note:
*A mere blend of 175 parts of phenol resin C and 3.5 parts of silane compound E was used.

A semiconductor chip (6.5 mm×6.5 mm) on a die bonding plate (7 mm×7 mm) was encapsulated with each of the thus prepared epoxy resin compositions by transfer molding to obtain a 80-pin QFP (quartered flat package) (20 mm×14 mm×2.5 mm (t)). The resulting semiconductor device was subjected to dip soldering under conditions of 260° C.×10 seconds. Thereafter, the device was allowed to stand in an atmosphere of 85° C. and 85% RH, and a critical moisture absorption time required for occurrence of package cracking was measured.

Each epoxy resin composition was cured at 180° C. for 5 hours to prepare a disc specimen having a diameter of 50 mm and a thickness of 3 mm. The disc was allowed to absorb moisture at 85° C. and 85% RH for 500 hours, and the saturated moisture absorption (%) was measured. Further, a flexural strength of the specimen was measured at 260° C. in accordance with JIS K-6911 5.17.

Figure 3A:
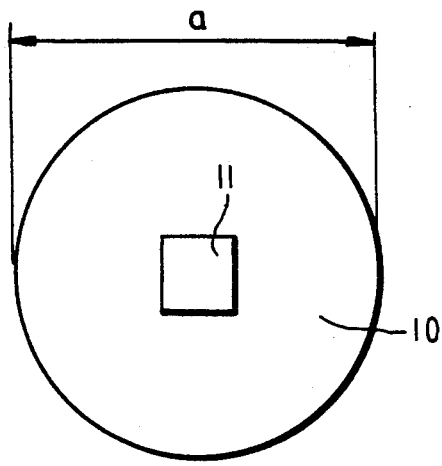
FIG. 3-(A) is a plane view of a test specimen for measuring adhesion between a semiconductor chip and a cured product of an epoxy resin composition as tested in Examples and Comparative Examples.
Figure 3B:
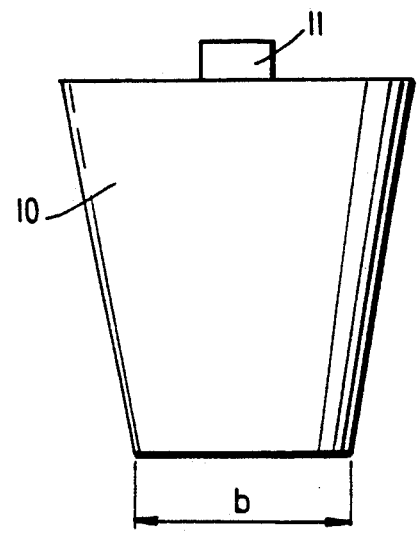

Each epoxy resin composition was cured to prepare truncated corn 10 having a top diameter (a) of 11 mm, a bottom diameter (b) of 9 mm, and a height (h) of 10 mm as shown in FIG. 3. Semiconductor chip 11 (2 mm×2 mm×0.4 mm (t)) was mounted on the center of the top surface of truncated corn 10, and a shear adhesive strength between chip 11 and corn 10 was measured.

A QFP prepared in the same manner as in Examples 8 to 14 and Comparative Examples 5 to 8 was allowed to absorb moisture in atmosphere of 85° C. and 85% for 72 hours and then subjected to dip soldering at 260° C. for 10 seconds. The package was then allowed to stand at 121° C. and 100% RH, and a mean time to 50% failure due to corrosion of the aluminum pattern on the chip surface was measured. Further, the package after soldering was subjected to a heat cycle test (150° C. to −60° C., 300 cycles), and the deformation of the aluminum pattern due to thermal stress given by the resin seal was measured.

The results of these measurements are shown in Tables 5-1 and 5-2 below.

tions according to the present invention also proved to have satisfactory adhesion to the chip.

While the invention has been described in detail and with reference to specific examples thereof, it will be apparent to one skilled in the art that various changes and modifications can be made therein without departing from the spirit and scope thereof.

What is claimed is:

1. A semiconductor device in which a semiconductor chip is encapsulated in an epoxy resin composition comprising (A) an epoxy resin represented by formula (I):

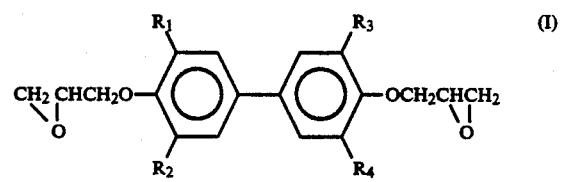

wherein $R_1$, $R_2$, $R_3$, and $R_4$ each represents an alkyl group having from 1 to 4 carbon atoms, and (B) a reaction product obtained by preliminarily reacting a silane compound represented by formula (II):

wherein X represents a monovalent organic group having at least one functional group selected from the group consisting of a glycidyl group, an amino group, and a mercapto group; Y represents an alkoxy group

TABLE 5

| | Example No. | | | | | | | Comparative Example No. | | | |
|---|---|---|---|---|---|---|---|---|---|---|---|
| | 1 | 2 | 3 | 4 | 5 | 6 | 7 | 1 | 2 | 3 | 4 |
| Adhesive Strength (kg/mm$^2$) | 4 | 7 | 6 | 5 | 4 | 4 | 5 | 4 | 5 | 1.5 | 5 |
| Saturated Moisture Absorption (%) | 0.30 | 0.31 | 0.32 | 0.35 | 0.38 | 0.39 | 0.33 | 0.51 | 0.52 | 0.30 | 0.70 |
| Flexural Strength (kg/mm$^2$) | 0.6 | 0.5 | 0.6 | 0.9 | 0.5 | 0.7 | 0.6 | 0.6 | 0.6 | 0.6 | 0.7 |
| Critical Moisture Absorption Time (hr) | >72 | >72 | >72 | >72 | >72 | >72 | >72 | 48 | 48 | >72 | 24 |

| | Example No. | | | | | | | Comparative Example No. | | | |
|---|---|---|---|---|---|---|---|---|---|---|---|
| | 8 | 9 | 10 | 11 | 12 | 13 | 14 | 5 | 6 | 7 | 8 |
| Adhesive Strength (kg/mm$^2$) | 6 | 6 | 8 | 6 | 6 | 7 | 7 | 4 | 5 | 4 | 5 |
| Critical Moisture Absorption Time (hr) | >72 | >72 | >72 | >72 | >72 | >72 | >72 | 24 | 24 | 48 | 48 |
| Mean Time to 50% Failure (hr) | >500 | >500 | >500 | >500 | >500 | >500 | >500 | 100 | 300 | >500 | >500 |
| Deformation of Aluminum Pattern (μm) | 1-2 | 1-2 | 1-2 | 1-2 | 1-2 | 1-2 | 1-2 | >4 | 1-2 | 1-2 | 1-2 |

As can be seen from the results in the Tables, although the comparative resin composition of Comparative Example 3 has a low saturated moisture absorption and a long critical moisture absorption time, it has poor adhesion to the chip. While the other comparative samples exhibit adhesion to the chip to some extent, they have a high saturated moisture absorption and a short critical moisture absorption time. To the contrary, every sample according to the present invention has proved excellent in moisture resistant reliability and low stress in high temperature. Further, the devices of Examples 8 to 16 has a longer time to failure and is less liable to aluminum pattern deformation, proving more excellent in low stress properties. All the resin composihaving from 1 to 4 carbon atoms; and n represents 0, 1 or 2, with a phenol aralkyl resin represented by formula (III):

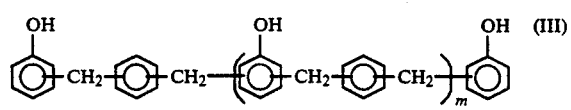

wherein m represents 0 or a positive integer.

2. A semiconductor device as claimed in claim 1, wherein at least one of components (A) and (B) is an organopolysiloxane-modified compound obtained by reacting said epoxy resin or reaction product with an organopolysiloxane represented by formula (IV):

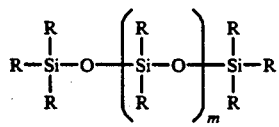 (IV)

wherein R's, which may be the same or different, each represents a monovalent organic group, provided that at least two of them are selected from the group consisting of an amino-substituted organic group, an epoxy-substituted organic group, a hydroxyl-substituted organic group, a vinyl-substituted organic group, a mercapto-substituted organic group, and a carboxyl-substituted organic group; and m represents an integer of from 0 to 500.

3. A semiconductor device as claimed in claim 1, wherein said silane compound is at least one compound selected from the group consisting of 3-glycidoxypropyltrimethoxysilane, 3-aminopropyltrimethoxysilane, and 3-mercaptopropyltrimethoxysilane.

4. A semiconductor device as claimed in claim 2, wherein said silane compound is at least one compound selected from the group consisting of 3-glycidoxypropyltrimethoxysilane, 3-aminopropyltrimethoxysilane, and 3-mercaptopropyltrimethoxysilane.

5. A semiconductor divice as claimed in claim 1, wherein said X is a monovalent organic group having at least one functional group selected from the group consisting of a glycidyl group and a mercapto group.

6. An epoxy resin composition for semiconductor chip encapsulation which comprises an epoxy resin represented by formula (I):

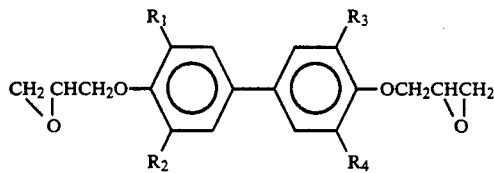 (I)

wherein $R_1$, $R_2$, $R_3$, and $R_4$ each represents an alkyl group having from 1 to 4 carbon atoms, and (B) a reaction product obtained by preliminarily reacting a silane compound represented by formula (II):

 (II)

wherein X represents a monovalent organic group having at least one functional group selected from the group consisting of a glycidyl group, an amino group, and a mercapto group; Y represents an alkoxy group having from 1 to 4 carbon atoms; and n represents 0, 1 or 2, with a phenol aralkyl resin represented by formula (III):

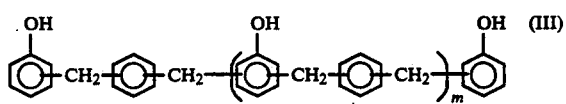 (III)

wherein m represents 0 or a positive integer.

7. An epoxy resin composition as claimed in claim 6, wherein at least one of components (A) and (B) is an organopolysiloxane-modified compound obtained by reacting said epoxy resin or reaction product with an organopolysiloxane represented by formula (IV):

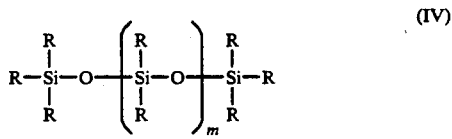 (IV)

wherein R's, which may be the same or different, each represents a monovalent organic group, provided that at least two of them are selected from the group consisting of an amino-substituted organic group, an epoxy-substituted organic group, a hydroxyl-substituted organic group, a vinyl-substituted organic group, a mercapto-substituted organic group, and a carboxyl-substituted organic group; and m represents an integer of from 0 to 500.

8. An epoxy resin composition as claimed in claim 6, wherein said X is a monovalent organic group having at least one functional group selected from the group consisting of a glycidyl group and a mercapto group.

* * * * *